United States Patent
Cote et al.

(10) Patent No.: US 10,788,530 B1
(45) Date of Patent: *Sep. 29, 2020

(54) EFFICIENT AND FLEXIBLE NETWORK FOR STREAMING DATA IN CIRCUITS

(71) Applicant: Mentor Graphics Corporation, Wilsonville, OR (US)

(72) Inventors: Jean-Francois Cote, Gatineau (CA); Mark A. Kassab, Wilsonville, OR (US); Janusz Rajski, West Linn, OR (US)

(73) Assignee: Mentor Graphics Corporation, Wilsonville, OR (US)

( * ) Notice: Subject to any disclaimer, the term of this patent is extended or adjusted under 35 U.S.C. 154(b) by 146 days.

This patent is subject to a terminal disclaimer.

(21) Appl. No.: 15/925,642

(22) Filed: Mar. 19, 2018

Related U.S. Application Data

(60) Provisional application No. 62/473,290, filed on Mar. 17, 2017.

(51) Int. Cl.
   *G01R 31/28* (2006.01)
(52) U.S. Cl.
   CPC ..... *G01R 31/2884* (2013.01); *G01R 31/2856* (2013.01); *G01R 31/2889* (2013.01)
(58) Field of Classification Search
   CPC . H04L 41/0813; H04L 43/50; G01R 31/3177; G06F 11/221; G11C 2029/0409; H03K 19/17764; H03K 19/17736
   See application file for complete search history.

(56) References Cited

U.S. PATENT DOCUMENTS

| | | | |
|---|---|---|---|
| 6,934,900 B1 | 8/2005 | Cheng et al. | |
| 6,990,619 B1 | 1/2006 | Kapur et al. | |
| 7,406,642 B1 | 7/2008 | Lau | |
| 7,453,899 B1 * | 11/2008 | Vaida | H04L 45/00 370/419 |
| 7,595,655 B2 * | 9/2009 | Hutchings | H03K 19/17736 326/16 |
| 7,917,820 B1 | 3/2011 | Pavle et al. | |
| 9,606,176 B2 * | 3/2017 | Miller | G06F 11/221 |

(Continued)

OTHER PUBLICATIONS

G. Giles et al., "Test Access Mechanism for Multiple Identical Cores," IEEE International Test Conference, 2008.

(Continued)

*Primary Examiner* — Dady Chery

(57) ABSTRACT

Various aspects of the disclosed technology relate to streaming data to circuit blocks in a circuit. A system for streaming data in a circuit comprises a first network comprising first data channels and first interface devices and a second network comprising second data channels and second interface devices. Each of the first interface devices is coupled to ports of one of circuit blocks in the circuit and configurable to transport a plurality of equal-sized data packets consecutively. Each of the second interface devices is coupled to one of the first interface devices and configurable to transport configuration data to the first interface devices. The configuration data comprise data for determining whether or not a first interface device is activated and data for determining which bit or bits of each of the plurality of data packets to be captured, replaced, or captured and replaced by an activated first interface device.

30 Claims, 15 Drawing Sheets

(56) References Cited

U.S. PATENT DOCUMENTS

| | | | |
|---|---|---|---|
| 10,473,721 B1 | 11/2019 | Cote et al. | |
| 10,476,740 B1 | 11/2019 | Cote et al. | |
| 2009/0193305 A1 | 7/2009 | Liu et al. | |
| 2010/0189166 A1 | 7/2010 | Mori | |
| 2010/0271406 A1 | 10/2010 | Tazuke | |
| 2011/0068820 A1 | 3/2011 | Fox | |
| 2013/0083611 A1 | 4/2013 | Ware et al. | |
| 2013/0111286 A1 | 5/2013 | Tekumalla | |
| 2015/0029846 A1* | 1/2015 | Liou | H04L 47/122 370/230.1 |
| 2015/0236895 A1* | 8/2015 | Kay | H04L 43/045 709/224 |
| 2015/0285854 A1 | 10/2015 | Kassab et al. | |
| 2015/0293173 A1 | 10/2015 | Tsuboi et al. | |
| 2016/0164734 A1* | 6/2016 | Durgin | H04L 45/24 370/389 |

OTHER PUBLICATIONS

G. Colon-Bonet, "High Bandwidth DFT Fabric Requirements for Server and Microserver SoCs," IEEE International Test Conference, 2015.

A. Sanghani et al., "Design and Implementation of a Time-Division Multiplexing Scan Architecture Using Serializer and Deserializer in GPU Chips," IEEE VLSI Test Symposium, 2011.

M. Sonawane et al., "Flexible Scan Interface Architecture for Complex SoCs," IEEE VLSI Test Symposium, 2016.

* cited by examiner

EFFICIENT AND FLEXIBLE NETWORK FOR STREAMING DATA IN CIRCUITS

RELATED APPLICATIONS

This application claims the benefit of U.S. Provisional Patent Application No. 62/473,290, filed on Mar. 17, 2017, and naming Jean-Francois Cote et al. as inventors, which application is incorporated entirely herein by reference.

FIELD OF THE DISCLOSED TECHNOLOGY

The presently disclosed technology relates to the field of integrated circuit design, verification, manufacture and test. Various implementations of the disclosed technology may be particularly useful for streaming data (in particular test data) to circuit blocks in a circuit.

BACKGROUND OF THE DISCLOSED TECHNOLOGY

With some integrated circuits growing to include billions of transitions, it is virtually impossible to design them flat (with no partitioning). Electronic Design Automation (EDA) tools would not be able to process them efficiently. Additionally, there is significant reuse of Intellectual Property (IP) from one design to another. Large designs, known as Systems-On-A-Chip (SOCs), include a large number of "cores" that are used as building blocks (also referred to circuit blocks). Each core is usually designed and validated individually first, then integrated with other cores to form the entire SOC. This is known as hierarchical design. Ideally, as much of the design and validation work is done at the core level, which is smaller and more manageable, leaving the integration and chip-level validation to be done at the top level. All work done at the core level can also be done earlier when working on the core, and moved out of the critical path when the SOC comes together closer to the tape-out deadline.

As designs have grown, the number of levels of core hierarchy has grown as well. Hierarchical design started with two levels of hierarchy: The core level and the chip/top level. Increasingly, cores are first integrated into larger sized cores or sub-systems, then integrated into the chip. This represents three levels of core hierarchy. Some large designs can have even more levels of core hierarchy.

Just as design adopted hierarchical design to manage complexity, so has scan test. In hierarchical test methodologies, the scan chains and compression logic are inserted into every core. The test patterns are generated and validated at the core level to test most of the logic in the core. Subsequently, the patterns from multiple cores are retargeted or mapped to the top level. They are also merged with retargeted patterns for other cores that will be tested at the same time. In addition to retargeting patterns generated for testing most of the content of each core, test pattern generation is also run at the next level up to test peripheral logic between the cores as well as logic at that level that is involved in integrating the cores. If this higher level is not the chip level, then those patterns will also have to be retargeted to the chip level.

The same test pattern generation and retargeting methodology is applied recursively regardless of the levels of hierarchy, but the planning and design of design for test (DFT) gets more complex with additional levels of hierarchy when using conventional scan access methods.

There are several challenges in planning and implementing hierarchical scan test in SOCs, most related to providing access to the scan channels in the cores. A scan channel is a channel connecting to inputs/outputs of scan chains, inputs/outputs of test controllers for test compression, or a combination thereof. When retargeting and merging core-level patterns to the top level, usually a subset of cores are tested at any given time due to two reasons: First, the power dissipation may not allow all cores to be tested concurrently; and second, the number of chip-level Inputs/Outputs (I/Os, or ports) does not allow all core-level channels to be accessed simultaneously.

For any group of cores that are to be tested concurrently, their channel inputs and outputs need to be connected to different chip-level I/Os when employing the conventional point-to-point scan access methods (sometimes referred to as star or switch topologies). Since there are usually more core-level channels that chip-level I/Os available for scan, the pin availability limits the number of cores that can be tested concurrently, and increases the number of groups (test sessions). Each top-level I/O can connect to a different core-level pin in each group. With time, the number of cores is growing, and the number of chip-level I/Os available for scan test is diminishing, such that fewer and fewer cores can be accessed directly from chip-level I/Os and tested concurrently.

Part of the planning is to identify up-front groups of cores that will be tested concurrently and plan connectivity between chip-level I/Os and core-level channels for each static configuration. This results in sub-optimal results since it creates fixed core groupings, often before the cores are available so that their test pattern counts can be estimated. In addition, the number of channels needed by each core can only be optimized after the core is available and Automatic Test Pattern Generation (ATPG) can be performed. However, this is only available late in the design cycle, and the number of core-level channels affects the static core grouping and planning of connectivity. All this leads to dependencies between the core level design and the top level design, and leads to sub-optimal decisions having to be made early on. As the number of levels of core hierarchy increases, the complexity multiplies.

Adding to the complexity are physical implementation (layout) considerations. Connecting multiple cores to each I/O can lead to routing congestion. The I/Os can also be embedded inside cores when using flip-chip technology. So the connections for one core impact the design of other cores to which the signals have to be connected, or through which the scan connections flow.

FIG. 1A illustrates an example of a circuit 100. The circuit 100 has five cores (circuit blocks) 110, 120, 130, 140 and 150. Among them, the cores 140 and 150 are the same core instantiated twice, known as identical core instances. General-Purpose I/O (GPIO) pads are commonly used for scan access at the chip level. The embedded deterministic test (EDT) blocks 115, 125, 135, 145, 155, 165, and 175, are where scan data are loaded and unloaded. There is scan logic in each of the cores, as well as at the chip level.

FIG. 1B illustrates one retargeting mode for testing the circuit 100. In this mode, the access between the chip-level I/Os (the GPIO pads) and cores 110, 120 and 130 are established. The EDT blocks 115, 125 and 135 are shown as being in the active mode for testing the cores 110, 120 and 130, respectively. FIG. 1C illustrates another retargeting mode for testing the circuit 100. Here, the identical core instances 140 and 150 can be tested as the scan channels in these two cores can be accessed through the GPIO pads.

Here, the EDT blocks 145 and 155 are in the active mode. When different core-level scan channels connect to different I/Os in different groups, multiplexing needs to be added. The control of the multiplexers can be programmed statically once at the start of each test session.

FIG. 1D illustrates an example of the external test mode. In this mode, the logic at the top level plus the boundaries of the cores is tested. So at least the EDT controllers 165 and 175 at the top level need to be driven (in the active mode). Based on the scan architecture, some EDT controllers inside the cores (that drive the boundary scan chains in the cores) may also need to be accessed simultaneously.

A relatively recent trend in SOC design, referred to as tile-based layout, is adding further complexity and constraints to DFT architectures. In tile-based designs, virtually all logic and routing is done within the cores and not at the top level. The cores abut one another when integrated into the chip with connections flowing from one core to the next. Any connectivity between cores has to flow through cores that are between them. Logic that is logically at the top level has to be pushed into the cores and designed as part of the cores. FIG. 1E illustrates an example of a tile-based circuit and two retargeting modes. Compared to FIGS. 1B-1D, no logic or routing could occur at the top level in FIG. 1E and all logic and connections are pushed into the cores.

When retargeting core-level patterns, limited chip-level I/O counts may be dealt with by increasing the number of core groups, as long as there are enough I/Os to drive at least each core individually. However, there are cases where access to multiple cores simultaneously, including access to all cores simultaneously, is necessary and grouping cores into smaller groups is not an option.

In an ideal hierarchical test, the internals of each core are tested when retargetable patterns are generated for the core, and the periphery of the core plus logic at the next level up are tested when pattern generation is performed at the next level and the lower level cores are placed into their external test modes. However, there are cases where pins of a core cannot be wrapped to provide this isolation, and the only way to test connections to/from cores is to run ATPG on them simultaneously while wrapping is disabled. To cover such logic, it is often necessary to test groups of cores simultaneously. If testing 8 cores simultaneously, for example, then with the traditional mux-based access, there must be enough chip-level I/Os to drive the channels of the 8 cores concurrently.

There are also cases where all EDT blocks must be accessed concurrently. For example, IDDQ is a test where data is scanned into the scan chains, then the current used by the entire chip is measured. If it exceeds a threshold, that indicates a silicon defect. IDDQ is usually applied across the entire chip, so for optimal efficiency, all scan chains in the entire design need to be loaded with every IDDQ scan pattern. When using scan compression like EDT, that means there must be enough I/Os to drive all the EDT channels of the cores concurrently.

Ideally, the channel count requirements within the chip should be decoupled from the chip-level I/O counts such that fewer chip-level I/Os can drive an arbitrarily larger number of core-level channels.

A general packet-based core access architecture has been proposed. In this architecture, each parallel word includes the address of the core (or core group) the information is destined for, an opcode indicating what to do with that data, and the actual payload. This architecture can work for both heterogeneous and identical cores. For identical cores, it supports efficient broadcast of stimuli and expected values (good-machine responses), on-chip comparison, and accumulation of pass/fail data such that multiple identical cores could be tested in near constant time. This architecture, however, is not efficient because there is significant overhead in every parallel word. Information that is not the payload, namely the address and opcode, occupies certain number of bits. A very narrow bus would not be able to support this architecture.

BRIEF SUMMARY OF THE DISCLOSED TECHNOLOGY

Various aspects of the disclosed technology relate to streaming data to circuit blocks in a circuit. In one aspect, there is a system for streaming data in a circuit, comprising: a first network comprising first data channels and first interface devices, the first interface devices comprising registers and clock signal generation logic, each of the first interface devices being coupled to ports of one of circuit blocks in the circuit, the first network configurable to transport a plurality of data packets consecutively, each of the plurality of data packets having m bits, each of the m bits being assigned to one of the circuit blocks preconfigured in an active mode, m being equal to or greater than a number of the first data channels used for the transporting the plurality of data packets; and a second network comprising one or more second data channels and second interface devices, each of the first interface devices being coupled to one of the second interface devices, the second network configurable to transport configuration data to the first interface devices, the configuration data comprising data for determining whether or not a first interface device in the first interface devices is activated and data for determining which bit or bits of each of the plurality of data packets to be captured, replaced, or captured and replaced by each of the first interface devices activated.

Each of the plurality of data packets may comprise one or more bits of a test pattern or a compressed test pattern for testing one or more of the circuit blocks, the clock signal generation logic in a first interface device coupled to ports of each of the one or more of the circuit blocks may be configurable to generate clock signals for scan-based testing, and the ports of each of the one or more of the circuit blocks may comprise inputs and outputs of scan chains, inputs and outputs of one or more test controllers, or a combination thereof. Each of the one or more test controllers comprises a decompressor and a compactor. The one or more test controllers may comprise EDT(embedded deterministic test)-based test controllers.

The first interface device coupled to ports of each of the one or more of the circuit blocks may be configurable to capture the one or more bits of the test pattern or the compressed test pattern from the each of the plurality of data packets and to replace the one or more bits of the test pattern or the compressed test pattern in the each of the plurality of data packets with one or more bits of test responses received from the ports of the each of the one or more of the circuit blocks.

Each of the plurality of data packets may further comprise one or more bits of good-machine test responses to the test pattern or the compressed test pattern, and the first interface device coupled to ports of each of the one or more of the circuit blocks may further comprise comparison circuitry configurable to generate one or more comparison bits by comparing one or more bits of test responses with the one or more bits of the good-machine test responses. The first interface device coupled to ports of each of the one or more of the circuit blocks may further comprise sticky pass/fail bit generation circuitry. A sticky pass/fail bit generated by the sticky pass/fail bit generation circuitry may be transported out of the circuit by the second network, the first network after reconfigured using the second network, or a third network.

Each of the plurality of data packets may further comprise one or more masking data bits masking one or more indeterminable bits (X bits) in the one or more bits of test responses for the comparison circuitry.

Each of the plurality of data packets may comprise bit or bits of data to be stored in memory circuitry in one or more of the circuit blocks in the active mode. The second network may conform to the IEEE 1687 standard (IJTAG, Internal Joint Test Action Group). The first network may further comprise multiplexing devices, pipeline devices or both, the multiplexing devices configurable to change data streaming path of the first network.

The number of the first data channels being used for the transporting the plurality of data packets may be smaller than the number of the first data channels in a particular setup. The particular setup may be a setup for wafer testing.

Assuming that the number of first data channels used for the transporting the plurality of data packets is n and that the first network transports the plurality of data packets at a rate of one n-bit word per clock cycle, if m is greater than n, bit assignment to the circuit blocks in the active mode for a particular n-bit word may repeat every LCM(m,n)/n clock cycles, LCM(m,n) being a least common multiple of m and n. In some embodiments of the disclosed technology, bits in each of the plurality of data packets are divided into bit blocks with bits in each of the bit blocks being next to bits in the each of the bit blocks except bits at two ends, and each of the bit blocks is assigned to one of the circuit blocks preconfigured in the active mode.

In another aspect, there are one or more non-transitory computer-readable media storing computer-executable instructions for causing a computer to perform a method, the method comprising: generating the above system in a circuit design.

Certain inventive aspects are set out in the accompanying independent and dependent claims. Features from the dependent claims may be combined with features of the independent claims and with features of other dependent claims as appropriate and not merely as explicitly set out in the claims.

Certain objects and advantages of various inventive aspects have been described herein above. Of course, it is to be understood that not necessarily all such objects or advantages may be achieved in accordance with any particular embodiment of the disclose technology. Thus, for example, those skilled in the art will recognize that the disclose technology may be embodied or carried out in a manner that achieves or optimizes one advantage or group of advantages as taught herein without necessarily achieving other objects or advantages as may be taught or suggested herein.

DETAILED DESCRIPTION OF THE DISCLOSED TECHNOLOGY

General Considerations

Figure 1A:
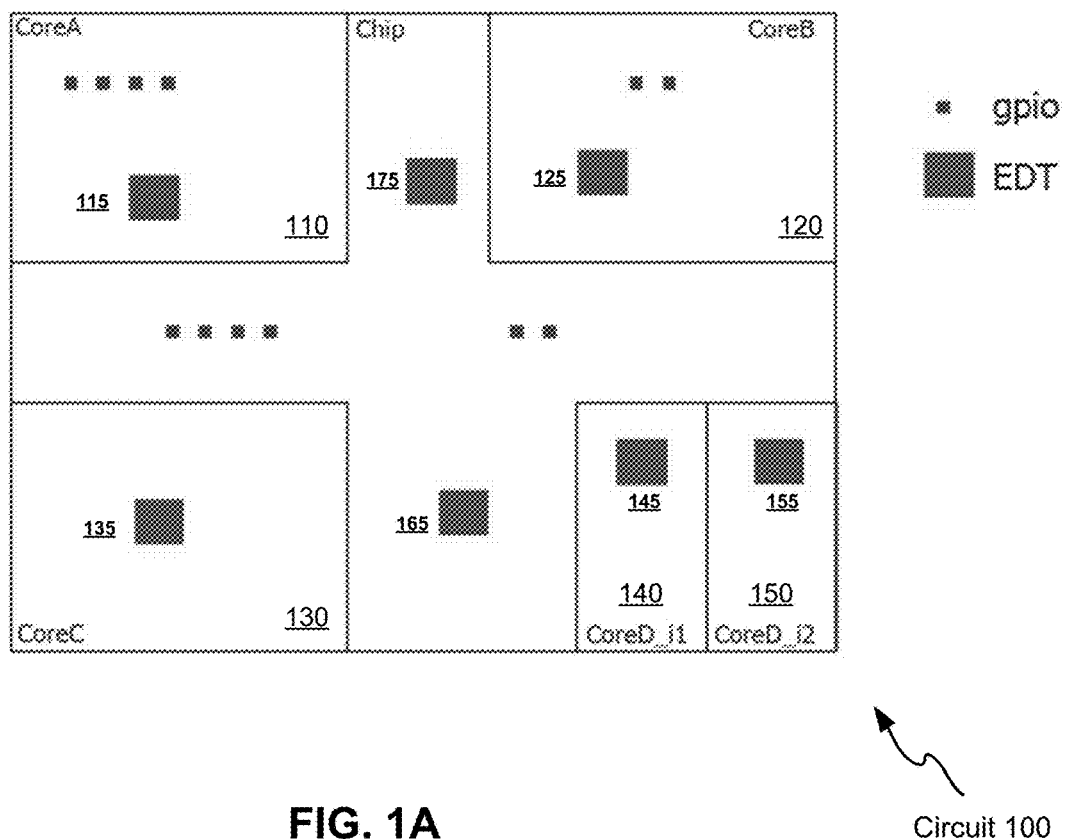
FIG. 1A illustrates an example of a circuit 100 having multiple circuit blocks.
Figure 1B:
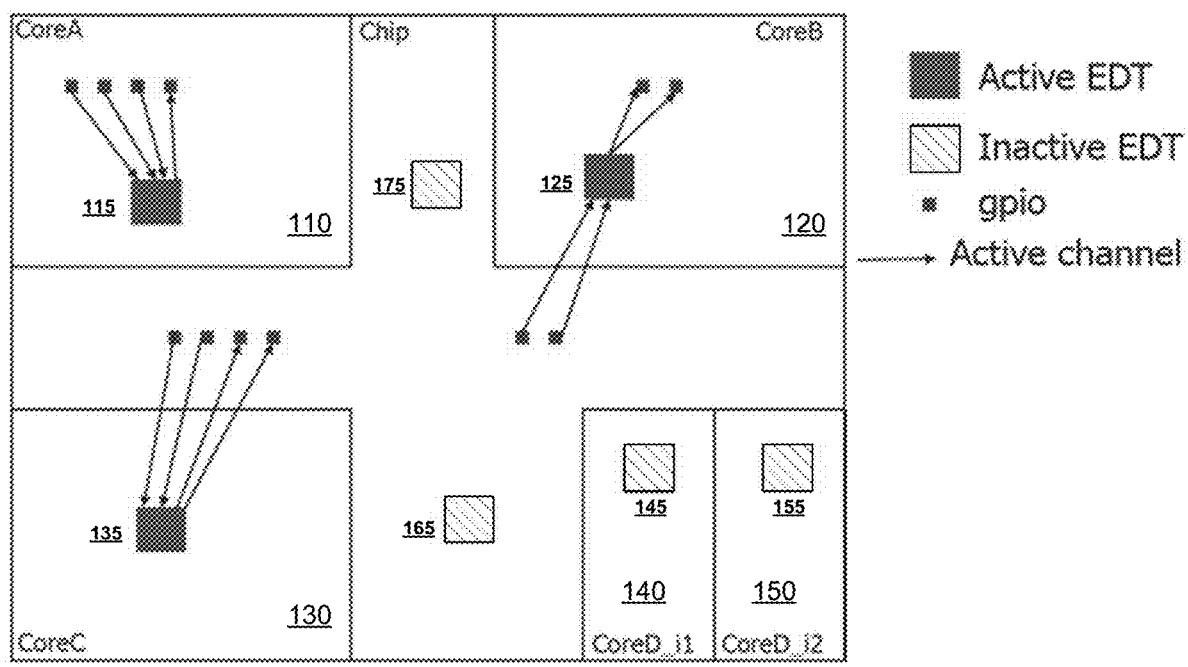
FIG. 1B illustrates one retargeting mode for testing the circuit 100.
Figure 1C:
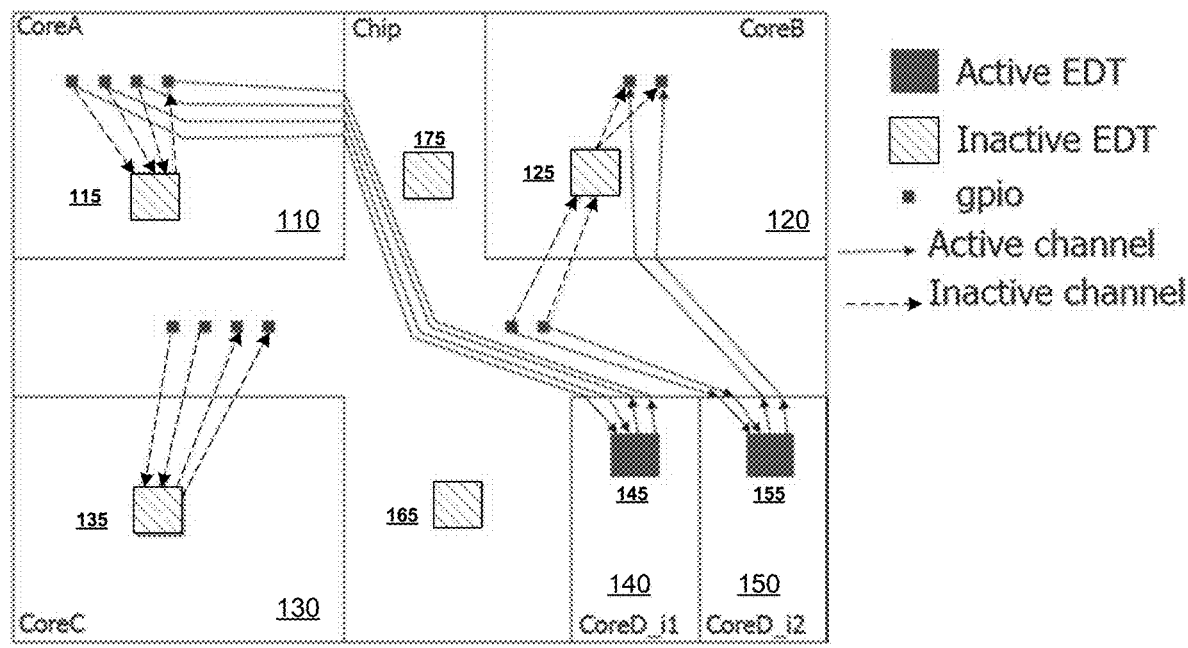
FIG. 1C illustrates another retargeting mode for testing the circuit 100.
Figure 1D:
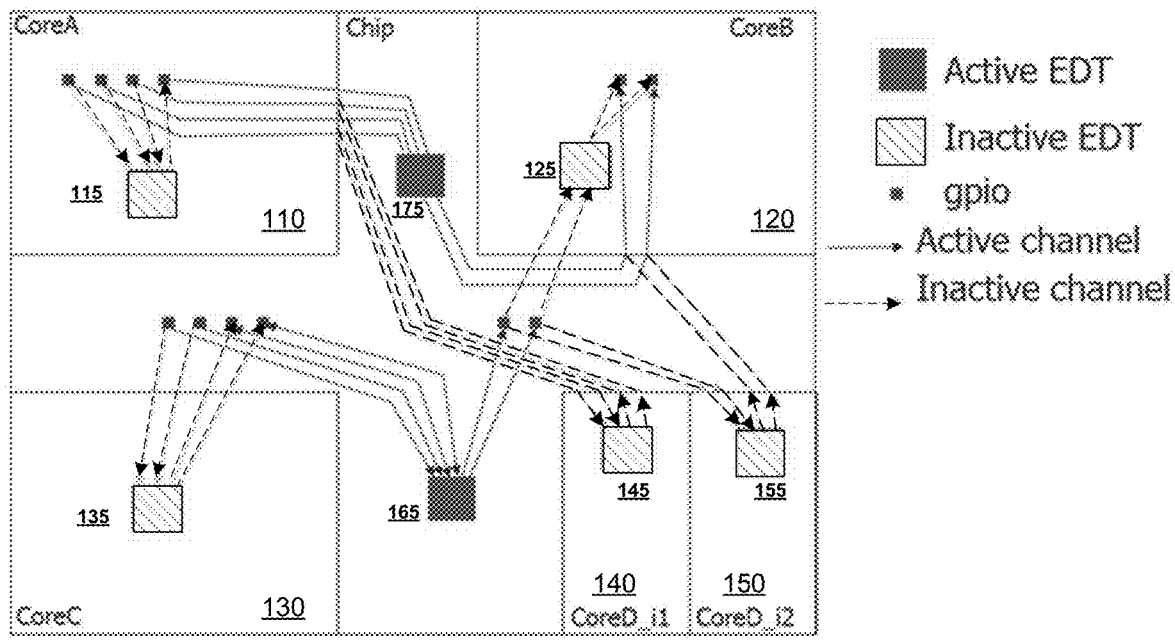
FIG. 1D illustrates the external test mode for testing the circuit 100.
Figure 1E:
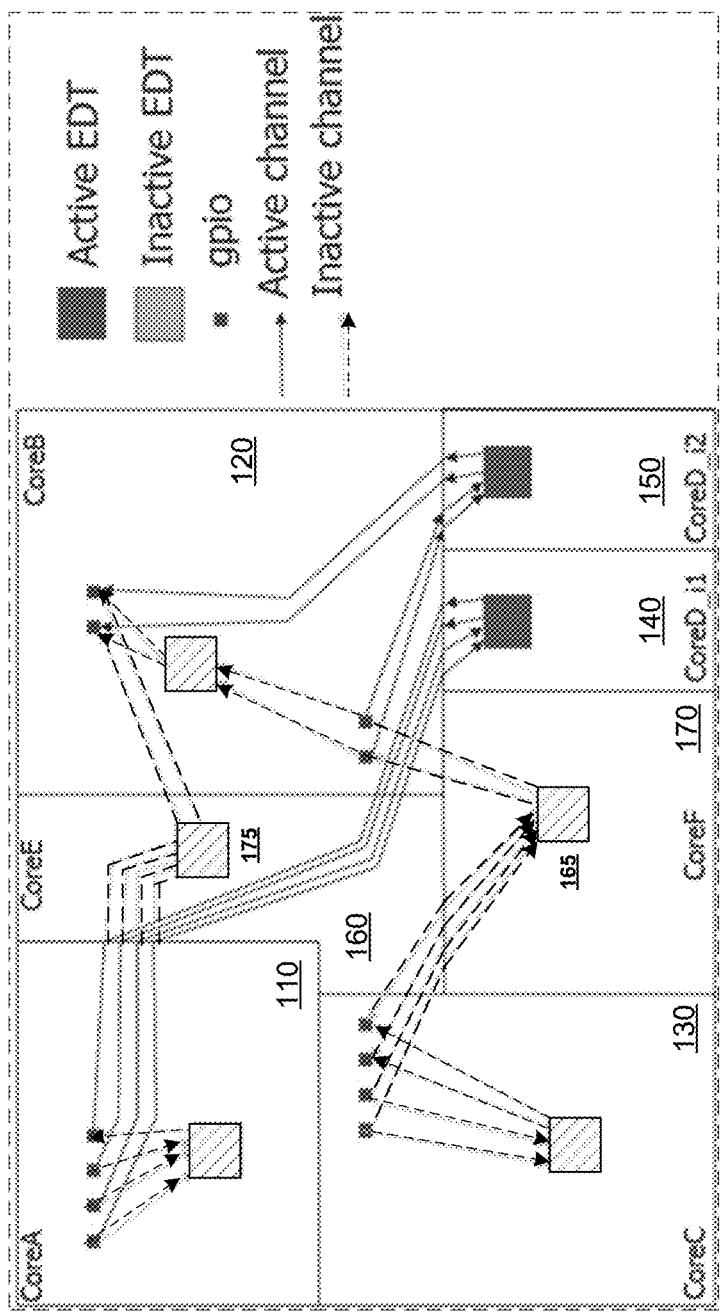
FIG. 1E illustrates an example of a tile-based circuit and two retargeting modes.

Various aspects of the disclosed technology relate to streaming data to circuit blocks in a circuit. In the following description, numerous details are set forth for the purpose of explanation. However, one of ordinary skill in the art will realize that the disclosed technology may be practiced without the use of these specific details. In other instances, well-known features have not been described in detail to avoid obscuring the presently disclosed technology.

The detailed description of a method or a device sometimes uses terms like "transport," "activate," and "generate" to describe the disclosed method or the device function/structure. Such terms are high-level abstractions. The actual operations or functions/structures that correspond to these terms will vary depending on the particular implementation and are readily discernible by one of ordinary skill in the art. It should also be appreciated by one of ordinary skill in the art that the term "coupled" means "connected directly or indirectly."

Although the operations of the disclosed methods are described in a particular sequential order for convenient presentation, it should be understood that this manner of description encompasses rearrangements, unless a particular ordering is required by specific language set forth below. For example, operations described sequentially may in some cases be rearranged or performed concurrently. Moreover, for the sake of simplicity, the disclosed flow charts and block diagrams typically do not show the various ways in which particular methods can be used in conjunction with other methods.

Design for Test, Scan-Based Test, and Test Compression

The reduction in feature size increases the probability that a manufacture defect in the integrated circuit will result in a faulty chip. A very small defect can result in a faulty transistor or interconnecting wire. Even a single faulty transistor or wire can cause the entire chip to function improperly. Manufacture defects are unavoidable nonetheless, no matter whether the manufacturing process is at the prototype stage or the high-volume manufacturing stage. It is thus necessary to test chips during the manufacturing process. Diagnosing faulty chips is also needed to ramp up and to maintain the manufacturing yield.

Testing typically includes applying a set of test stimuli (test patterns) to the circuit-under-test and then analyzing responses generated by the circuit-under-test. Functional testing attempts to validate that the circuit-under-test operates according to its functional specification while structural testing tries to ascertain that the circuit-under-test has been assembled correctly from some low-level building blocks as specified in a structural netlist and that these low-level building blocks and their wiring connections have been manufactured without defect. For structural testing, it is assumed that if functional verification has shown the correctness of the netlist and structural testing has confirmed the correct assembly of the structural circuit elements, then the circuit should function correctly. Structural testing has been widely adopted at least in part because it enables the test (test pattern) generation to focus on testing a limited number of relatively simple circuit elements rather than having to deal with an exponentially exploding multiplicity of functional states and state transitions.

To make it easier to develop and apply test patterns, certain testability features are added to circuit designs, which is referred to as design for test or design for testability (DFT). Scan testing is the most common DFT method. In a basic scan testing scheme, all or most of internal sequential state elements (latches, flip-flops, et al.) in a circuit design are made controllable and observable via a serial interface. These functional state elements are usually replaced with dual-purpose state elements called scan cells. Scan cells are connected together to form scan chains—serial shift registers for shifting in test patterns and shifting out test responses. A scan cell can operate as originally intended for functional purposes (functional/mission mode) and as a unit in a scan chain for scan (scan mode). A widely used type of scan cell include an edge-triggered flip-flop with two-way multiplexer for the data input. The two-way multiplexer is typically controlled by a single control signal called scan enable, which selects the input signal for a scan cell from either a scan signal input port or a system signal input port. The scan signal input port is typically connected to an output of another scan cell while the system signal input port is connected to the functional logic. Scan cells can serve as both a control point and an observation point. Control points can be used to set certain logic values at some locations of the circuit-under-test, exciting a fault and propagating the incorrect value to an observation point. Scan testing allows the test equipment to access gates deeply embedded through the primary inputs/outputs and/or some physical test points and can remove the need for complicated state transition sequences when trying to control or observe what is happening at some internal circuit element.

Test patterns for scan testing are typically generated through an automatic test pattern generation (ATPG) process. ATPG usually focuses on a set of faults derived from a gate-level fault model. A defect is an imperfection caused in a device during the manufacturing process. A fault model is a description of how a defect alters design behavior. In another word, a defect is a flaw or physical imperfection that may lead to a fault. For a given target fault, ATPG comprises two phases: fault activation and fault propagation. Fault activation establishes a signal value at the fault site opposite that produced by the fault. Fault propagation propagates the fault effect forward by sensitizing a path from a fault site to a scan cell or a primary output. A fault at a site is said to be detected by a test pattern if a test response value captured by a scan cell or a primary output is different than the expected value. The objective of ATPG is to find a test pattern that, when applied to the circuit, enables testers to distinguish between the correct circuit behavior and the faulty circuit behavior caused by one or more particular faults. Effectiveness of ATPG is measured by the fault coverage achieved for the fault model and the number of generated vectors (test pattern counts), which should be directly proportional to test application time. Here, the fault coverage is defined as a ratio of the number of detected faults vs. the total number of faults.

The most popular fault model used in practice is the single stuck-at fault model. In this model, one of the signal lines in a circuit is assumed to be stuck at a fixed logic value, regardless of what inputs are supplied to the circuit. The stuck-at fault model is a logical fault model because no delay information is associated with the fault definition. Delay faults cause errors in the functioning of a circuit based on its timing. They are caused by the finite rise and fall time periods of the signals in the gates, as well as, the propagation delay of interconnects between the gates. Transition faults are used for their simplicity in modeling spot defects that affect delays at inputs or outputs of gates. Under scan-based tests, the transition faults are associated with an extra delay that is large enough to cause the delay of any path through the fault site to exceed the clock period.

During the circuit design and manufacturing process, a manufacturing test screens out chips (dies) containing defects. The test itself, however, does not identify the reason for the unacceptable low or fluctuating yield that may be observed. Physical failure analysis (PFA) can inspect the faulty chip to locate the defect location(s) and to discover the root cause. The process usually includes etching away certain layers and then imaging the silicon surface by scanning electronic microscopy or focused ion beam systems. This PFA process is laborious and time consuming. To facilitate the PFA process, diagnosis is often employed to narrow down possible locations of the defect(s) based on analyzing the fail log (fail file, failure file). The fail log typically contains information about when (e.g., tester cycle), where (e.g., at what tester channel), and how (e.g., at what logic value) the test failed and which test patterns generate expected test responses. The layout information of the circuit design may also be employed to further reduce the number of defect suspects.

Test application in chip manufacturing test is normally performed by automatic test equipment (ATE) (a type of testers). Scan-based tests consume significant amounts of storage and test time on ATE. The data volume increases with the number of logic gates on the chip and the same holds for the number of scan cells. Yet, practical considerations and ATE specifications often limit both the number of pins available for scan in/out and the maximum scan frequency. It is highly desirable to reduce the amount of test data that need to be loaded onto ATE and ultimately to the circuit under test. Fortunately, test patterns are compressible mainly because only 1% to 5% of test pattern bits are typically specified bits (care bits) while the rest are unspecified bits (don't-care bits). Unspecified bits can take on any values with no impact on the fault coverage. Test compression may also take advantage of the fact that test cubes tend to be highly correlated. A test cube is a deterministic test pattern in which the don't-care bits are not filled by ATPG. The correlation exists because faults are structurally related in the circuit.

Various test compression techniques have been developed. In general, additional on-chip hardware before and after scan chains is inserted. The hardware (decompressor) added before scan chains is configured to decompress test stimulus coming from ATE, while the hardware (compactor) added after scan chains is configured to compact test responses captured by the scan chains. The decompressor expands the data from n tester channels to fill greater than n scan chains. The increase in the number of scan chains shortens each scan chain and thus reduces the number of clock cycles needed to shift in each test pattern. Thus, test compression can reduce not only the amount of data stored on the tester but also the test time for a given test data bandwidth.

The embedded deterministic test (EDT) is one example of test compression techniques. The EDT-based compression is composed of two complementary parts: hardware that is embedded on chip, and deterministic ATPG software that generates compressed patterns that utilize the embedded hardware. The EDT hardware features a continuous-flow decompressor. The EDT compression of test cubes is performed by treating the external test data as Boolean variables. Scan cells are conceptually filled with symbolic expressions that are linear functions of input variables injected into the decompressor. In the case of a decompressor comprising a ring generator and an associated phase shifter, a set of linear equations corresponding to scan cells whose values are specified may be used. A compressed pattern can be determined by solving the system of equations. If the compressed pattern determined as such is then scanned in through the decompressor, the bits that were specified by ATPG will be generated accordingly. Unspecified bits are set to pseudorandom values based on the decompressor architecture. Additional details concerning EDT-based compression and decompression are found in J. Raj ski, J. Tyszer, M. Kassab, and N. Mukherjee, "Embedded deterministic test," IEEE Trans. CAD, vol. 23, pp. 776-792, May 2004, and U.S. Pat. Nos. 6,327,687; 6,353, 842; 6,539,409; 6,543,020; 6,557,129; 6,684,358; 6,708, 192; 6,829,740; 6,874,109; 7,093,175; 7,111,209; 7,260, 591; 7,263,641; 7,478,296; 7,493,540; 7,500,163; 7,506, 232; 7,509,546; 7,523,372; 7,653,851, of which all are hereby incorporated herein by reference.

All of the above mentioned processes, design insertion for testing, test pattern generation, test compression, and test point insertion, are normally performed by various electronic design automation tools such as those in the Tessent family of software tools available from Mentor Graphics Corporation, Wilsonville, Oreg.

Data Streaming System Architecture

Figure 2:
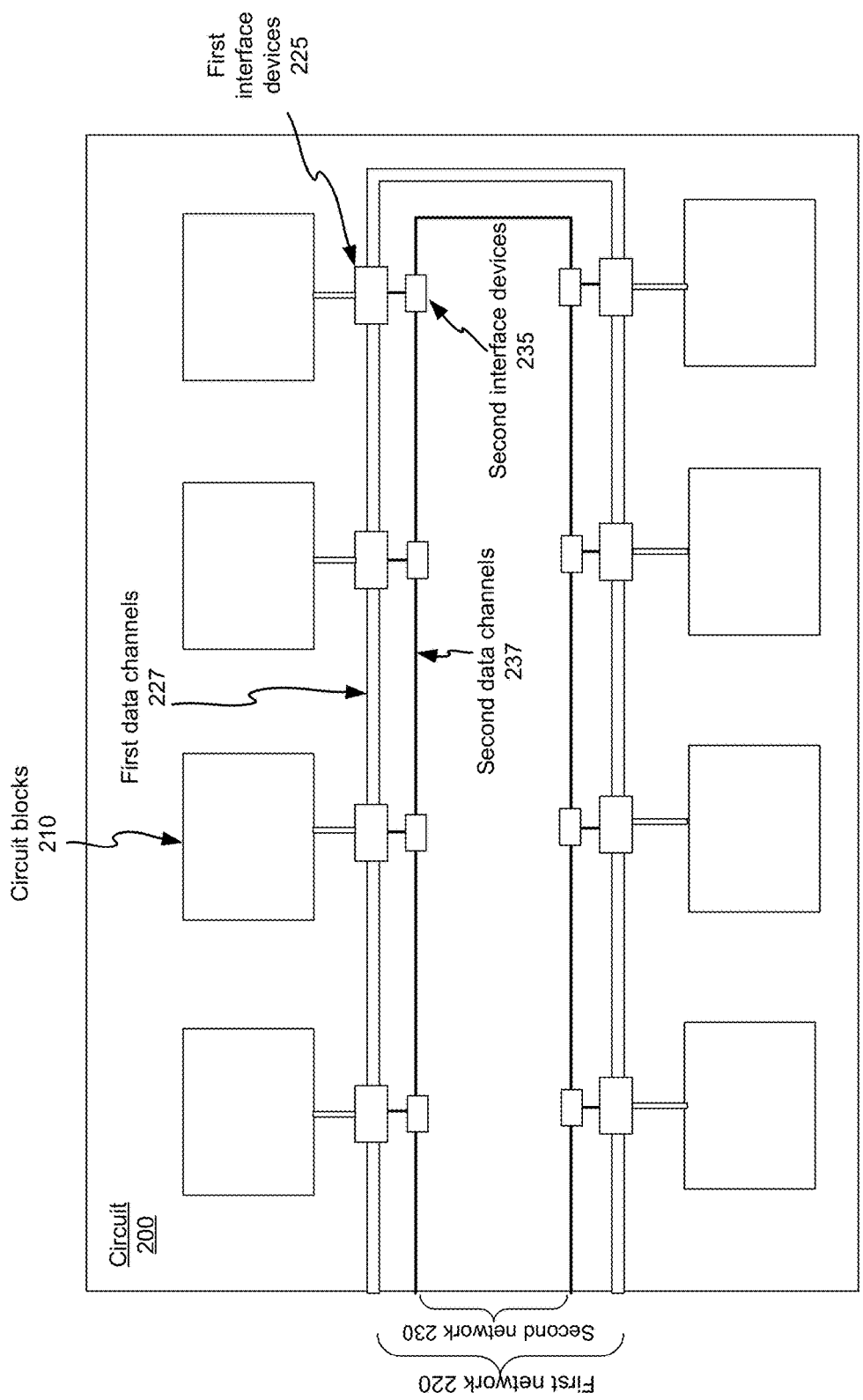
FIG. 2 illustrates an example of a system for streaming data in a circuit that may be implemented according to various embodiments of the disclosed technology.

FIG. 2 illustrates an example of a system for streaming data in a circuit 200 that may be implemented according to various embodiments of the disclosed technology. The system for streaming data comprises a first network 220 and a second network 230. The first network 220 comprises first data channels 227 (first data bus) and first interface devices 225. The second network 230 comprises one or more second data channels 237 (second data bus) and second interface devices 235. The first interface devices 225 comprises registers and clock signal generation logic. Each of the first interface devices 225 is coupled to ports of one of circuit blocks 210 in the circuit 200. Each of the first interface devices 225 is also coupled to one of the second interface devices 235. Inputs and outputs of the first data channels 227 can be connected to some chip-level I/Os (the GPIO pads). Inputs and outputs of the one or more second data channels 237 can also be connected to some other chip-level I/Os (the GPIO pads). While only one first network 220 and one second network 230 are shown in FIG. 2, a circuit can have multiple first networks 220 and one or more second networks 230.

The first network 220 is configurable to transport a plurality of data packets consecutively. Each of the plurality of data packets has m bits, and each of the m bits is assigned to one of the circuit blocks 210 preconfigured in an active mode. The active mode may be a mode for testing or a mode for loading/unloading data. Here m is equal to or greater than a number of the first data channels 225 used for the transporting the plurality of data packets. While the total number of the first data channels for a manufactured circuit is typically fixed, the number of the first data channels used for the transporting the plurality of data packets may be less than the total number. For example, a setup for wafer testing may not need all of the first data channels 225 while a setup for testing the same circuit in a system may take advantage of all of the first data channels 225.

Assume that the number of first data channels used for the transporting data packets is n. The first network 220 transports the data packets at a rate of one n-bit word per clock cycle, and if m is greater than n, the bit assignment to the circuit blocks 210 in the active mode for a particular n-bit word (bus word) repeats every LCM(m,n)/n clock cycles according to various embodiments of the disclosed technology. Here, LCM(m,n) is the least common multiple of m and n. In some bit assignments, bits in each of the plurality of data packets are divided into bit blocks, bits in each of the bit blocks are next to each other except bits at two ends of the block, and each of the bit blocks is assigned to one of the circuit blocks preconfigured in the active mode. Each of the first interface devices activated can be configured to keep track of the location of its data bits in each of the bus words.

Figure 3:
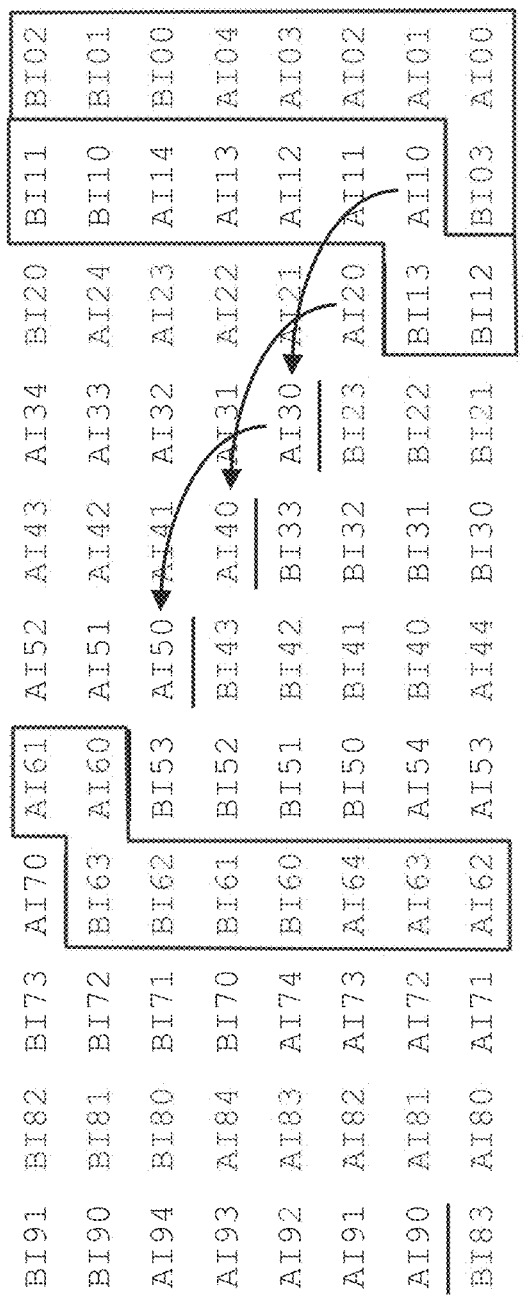
FIG. 3 illustrates an example of bit assignment for the first data channels used for transporting data packets according to some embodiments of the disclosed technology.

FIG. 3 illustrates an example of bit assignment for the first data channels 225 used for transporting data packets according to some embodiments of the disclosed technology. In this example, two circuit blocks (core A and core B) are being driven through the first network—exchanging data with the first network. One of them loads/unloads four bits per shift cycle of the circuit block, while the other loads/unloads five bits. The size of each data packet is therefore nine bits. In the figure, "AI" means data bits for the core A and "BI" means data bits for the core B. For the two circuit blocks to shift once, nine bits (m=9) have to be delivered. The number of the first data channels used for data streaming is eight, i.e., the bus for delivering the data is eight bits wide (n=8). The locations of the 9-bit packets within each 8-bit bus word thus rotate with each packet to use every bit of every bus word without using wasteful padding. As a result, the packet starts at the same bus bit position every nine clock cycles, i.e., repeating the same bit assignment every nine clock cycles. Further, each data packet is divided into two bit blocks. A data packet 310 in FIG. 3, for example, is divided into a bit block consisting of AI64-AI60 and a bit block consisting of BI60-BI63.

A data packet can be as wide as needed, and can occupy as many bus words as needed. The internal channel requirements (9 bits in the example shown in FIG. 3) are decoupled from the available scan pins at the chip level (8×2 I/O for scan in this case). If the packet is wider than the bus and occupies multiple bus words, the circuit block can shift less often than once every bus shift cycle but it will be possible to drive all the circuit blocks needed. Because the scan bus can usually shift data at a higher rate than the circuit blocks can shift internally, it can be possible to keep the circuit blocks shifting at their maximum rates even if they don't shift every bus clock cycle. With some implementations of the disclosed technology, the bus (the first data channels) can be re-programmed to reduce its active width such that it does not exceed the number of bits in a packet when the packet size (m) is less than the physical bus width (n).

Referring to FIG. 2, the second network 230 is configurable to transport configuration data to the first interface devices. The configuration data comprise data for determining whether or not a first interface device in the first interface devices 230 is activated and data for determining which bit or bits of each of the plurality of data packets to be captured, replaced, or captured and replaced by each of the first interface devices activated. The second network 230 may conform to the IEEE 1687 standard (IJTAG, Internal Joint Test Action Group).

A system for streaming data in a circuit that is implemented according to various embodiments of the disclosed technology may be used to deliver different types of data in the circuit such as data to be stored in memory circuitry and data for circuit testing. As noted previously, hierarchical design is used extensively nowadays. Packet-based streaming based on the disclosed technology can greatly improve test efficiency and flexibility for SOC designs. For testing one or more of the circuit blocks, each data packet comprises one or more bits of a test pattern or a compressed test pattern. Bits of multiple test patterns for testing different circuit blocks can be contained in each data packet as illustrated in FIG. 3.

Figure 4:
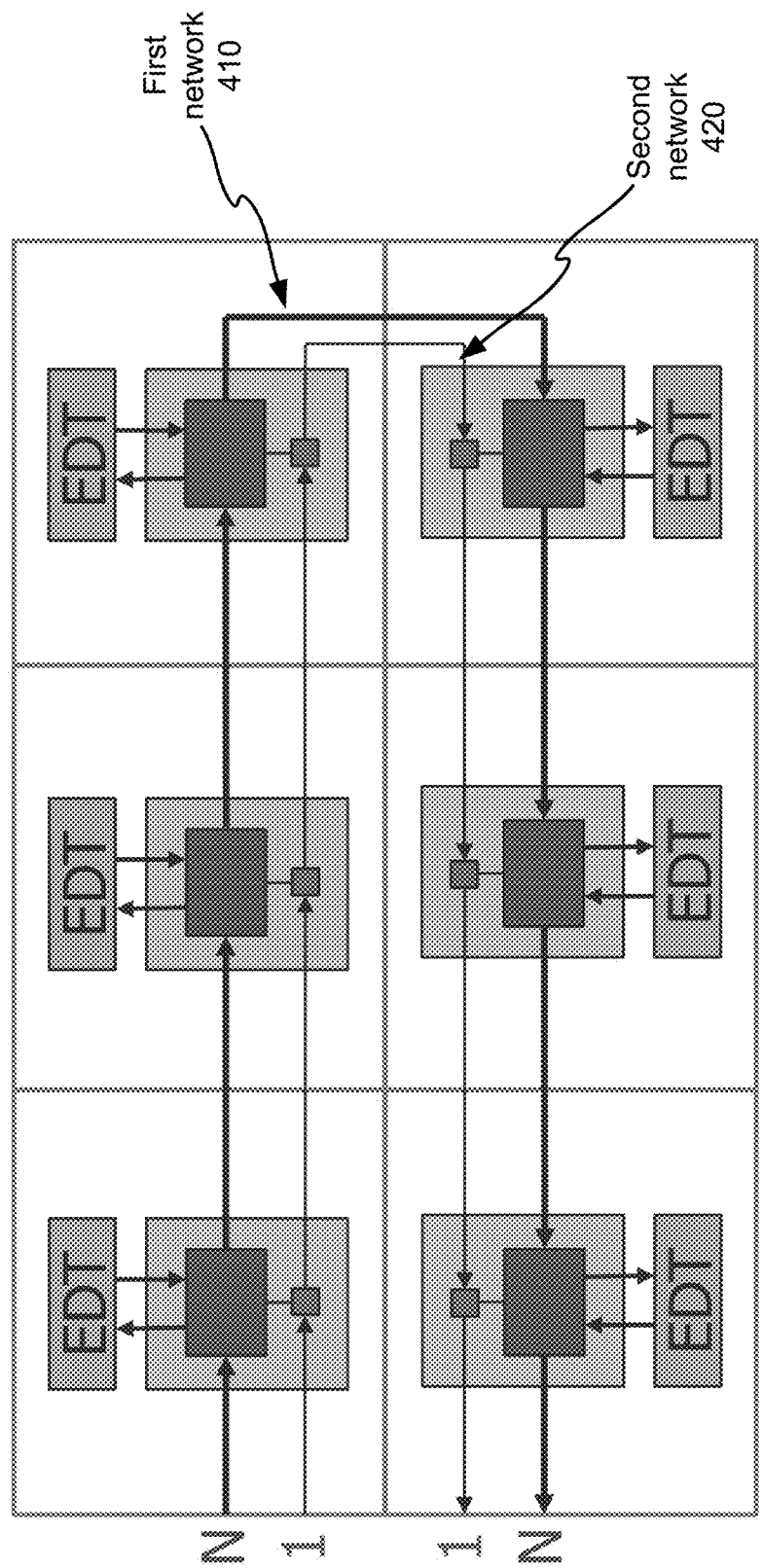
FIG. 4 illustrates an example of using a system of data streaming to deliver compressed test data to circuit blocks according to various embodiments of the disclosed technology.
Figure 5:
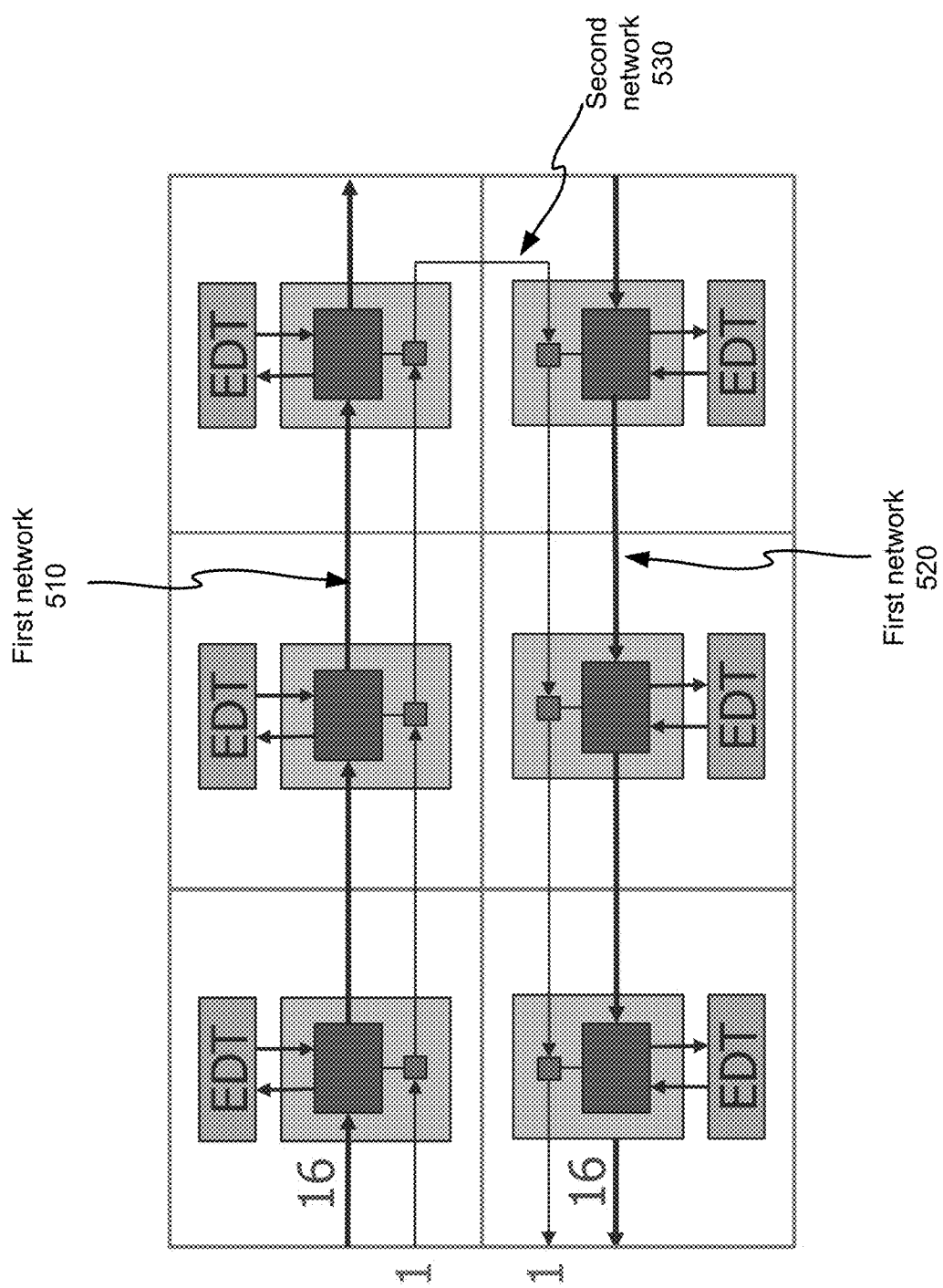
FIG. 5 illustrates another example of using a system of data streaming to deliver compressed test data.

An activated first interface device may be configured to capture bits of the test pattern or the compressed test pattern from each of the plurality of data packets based on the configuration data delivered by the second network and to replace the bits of the test pattern or the compressed test pattern in each of the plurality of data packets with bits of test responses received from the ports of the circuit block. The ports of the circuit block comprise inputs and outputs of scan chains, inputs and outputs of one or more test controllers, or a combination thereof. Each of the one or more test controllers comprises a decompressor and a compactor. The test controllers can be EDT(embedded deterministic test)-based test controllers. FIG. 4 illustrates an example of using a system of data streaming to deliver compressed test data to circuit blocks according to various embodiments of the disclosed technology. The system of data streaming comprises a first network 410 and a second network 420. The bus width for the first network 410 is N while the second network 420 has a single-bit bus, which may be an IJTAG network. The first interface devices for the first network 410 are connected to EDT channels in the circuit blocks. FIG. 5 illustrates another example of using a system of data streaming to deliver compressed test data. Unlike the system shown in FIG. 4, there are two 16-bit first networks 510 and 520 along with a one-bit second network. It should be noted that the bus inputs and outputs don't have to be at one location.

Figure 6A:
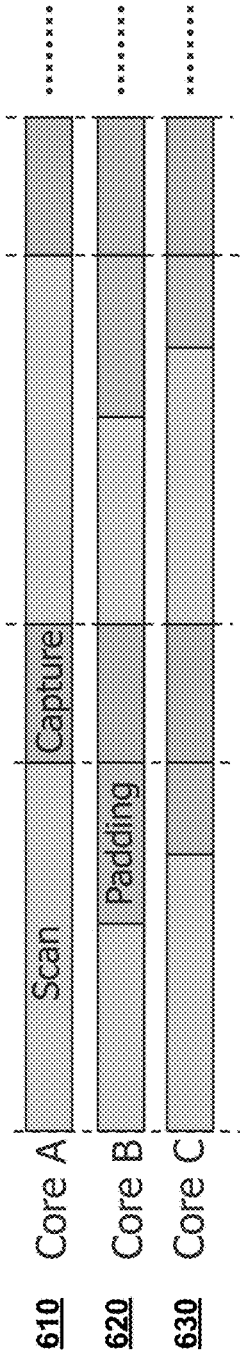
FIG. 6A illustrates an example of data packet streaming for synchronized capture.
Figure 6B:
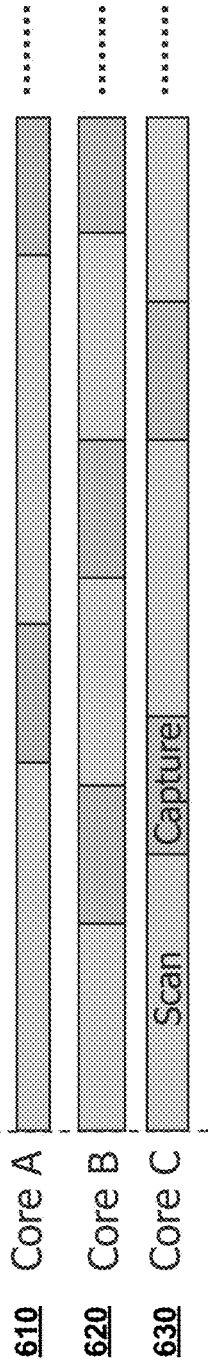
FIG. 6B illustrates an example of data packet streaming for independent capture.

The clock signal generation logic in a first interface may be configured to generate clock signals for scan-based testing, enabling independent capture for a group of circuit blocks that receive test data concurrently (from the same set of data packets). In most conventional architectures, the cores with shorter chains are padded (dummy data are shifted in before test stimuli) during the scan shift phase because all the cores need to capture at the same time. FIG. 6A illustrated such an example. Core 610 has longer scan chains than cores 620 and 630. To realize synchronized capture for the cores 610, 620 and 630, constant bits of "0's" or "1's" are shifted into the cores 620 and 630 along with test pattern bits for the core 610 at the early part of the scan shift phase. For independent capture, wasteful padding may not be needed, as illustrated in FIG. 6B. This enables efficient retargeting.

When running ATPG on a group of interacting cores, it is necessary to synchronize captures because of the interactions between the cores during capture. When pattern generation is performed on wrapped cores that are isolated from one another, and patterns for multiple cores are subsequently merged so they can be delivered concurrently, one can also align capture cycles as shown in FIG. 4A. However, in this case there is no need for this synchronization and wasteful padding. The disclosed technology allows independent capture due to its test access mechanism and clocking architecture. This allows more test data be delivered as shown in FIG. 4B, saving bandwidth and test time.

The disclosed technology can also support a combination of synchronized capture and independent capture. For example, synchronized mode is used for groups of cores that are part of a parent core, while independent mode is used between sets of different groups of cores.

Figure 7:
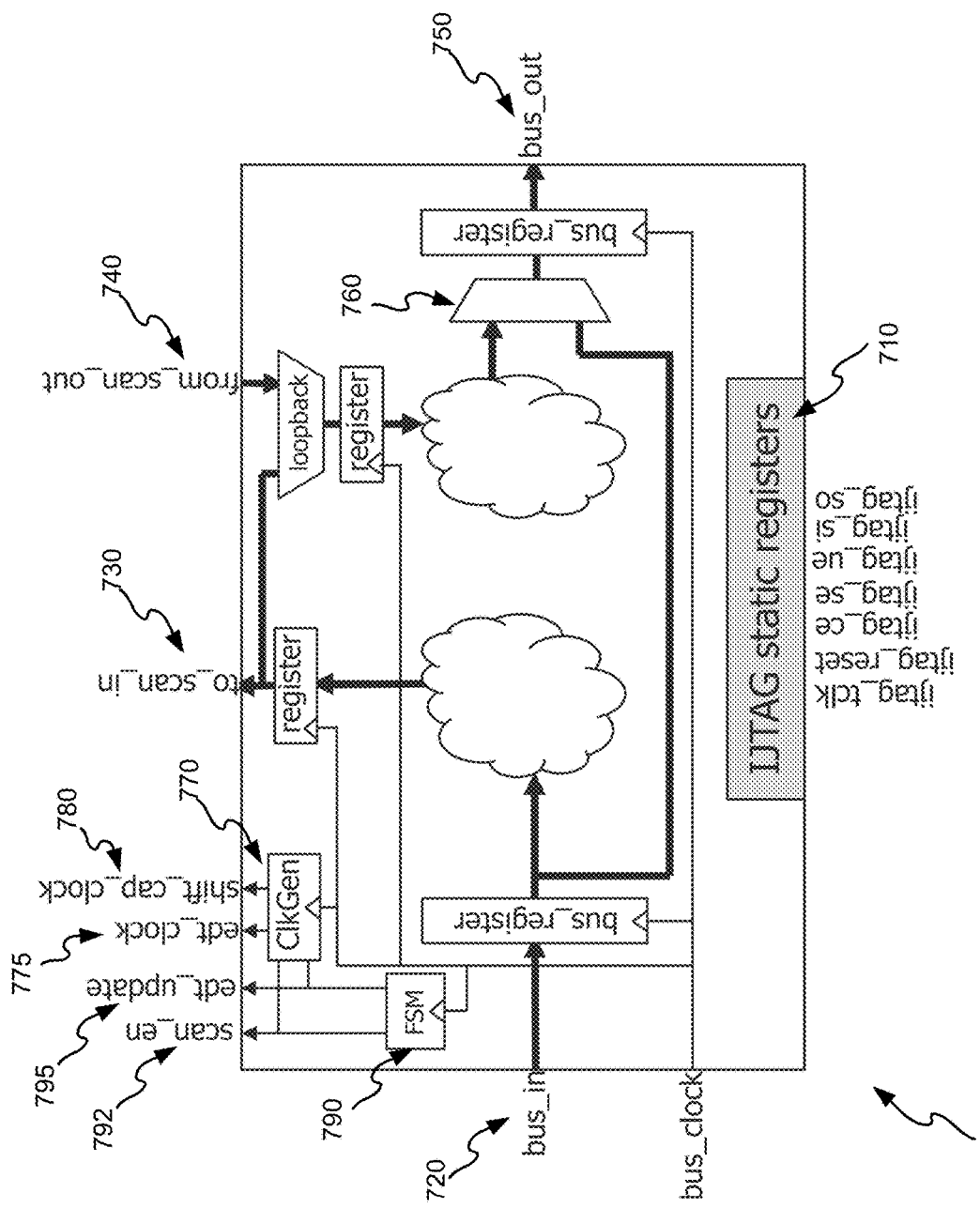
FIG. 7 illustrates an example of a first interface device according to some embodiments of the disclosed technology.

FIG. 7 illustrates an example of a first interface device 700 according to some embodiments of the disclosed technology. The first interface device 700 has multiple static registers 710, labelled as IJTAG static registers. The multiple static registers 710 are programmed (configured) prior to the start of the streaming. IJTAG or other access mechanism may be used for delivering data for programing. If the interface device 700 is activated, bits in the bus word received from bus in 720 will be selected and delivered to scan_in ports 730 while bits received from scan_out ports 740 will be added to the bus word before the bus word is transported out through bus_out 750 of the interface device 700. Because the data bits within a word that belong to a given core can rotate when the packet width is not a multiple of the bus width, the interface device 700 may use shifters to access the right bits. Additionally, since the bits within a packet that go to a core can be spread across multiple bus words, the data may have to be collected across multiple bus clock cycles before one shift cycle within the core can occur. The same can happen for the unloaded data. The data unloaded from one cycle of the core is to be inserted into a packet. That data can occupy part of a bus word, a whole bus word, or bits spread across multiple bus words. The interface device 700 have clock generation circuitry 770 for generating edt_clock 775 and shift cap_clock 780. A finite state machine 790 (FSM) is used to generate signals of scan_en 792 and edt_update 795. If the interface device 700 is not activated, the original bus word will bypass the internal logic and selected by a multiplexer 760 for output. As such, the interface device 700 acts as a pipeline stage within the first network.

The first interface device 700 may further comprise comparison circuitry. The comparison circuitry is configurable to generate one or more comparison bits by comparing one or more bits of test responses with corresponding one or more bits of good-machine test responses (expected test responses). Bits of the good machine test response are in each of the plurality of data packets along with bits of the test pattern or the compressed test pattern. The first interface device 700 may still further comprise sticky pass/fail bit generation circuitry. A sticky pass/fail bit generated by the sticky pass/fail bit generation circuitry can indicate whether a circuit block fails a test or not.

Figure 8A:
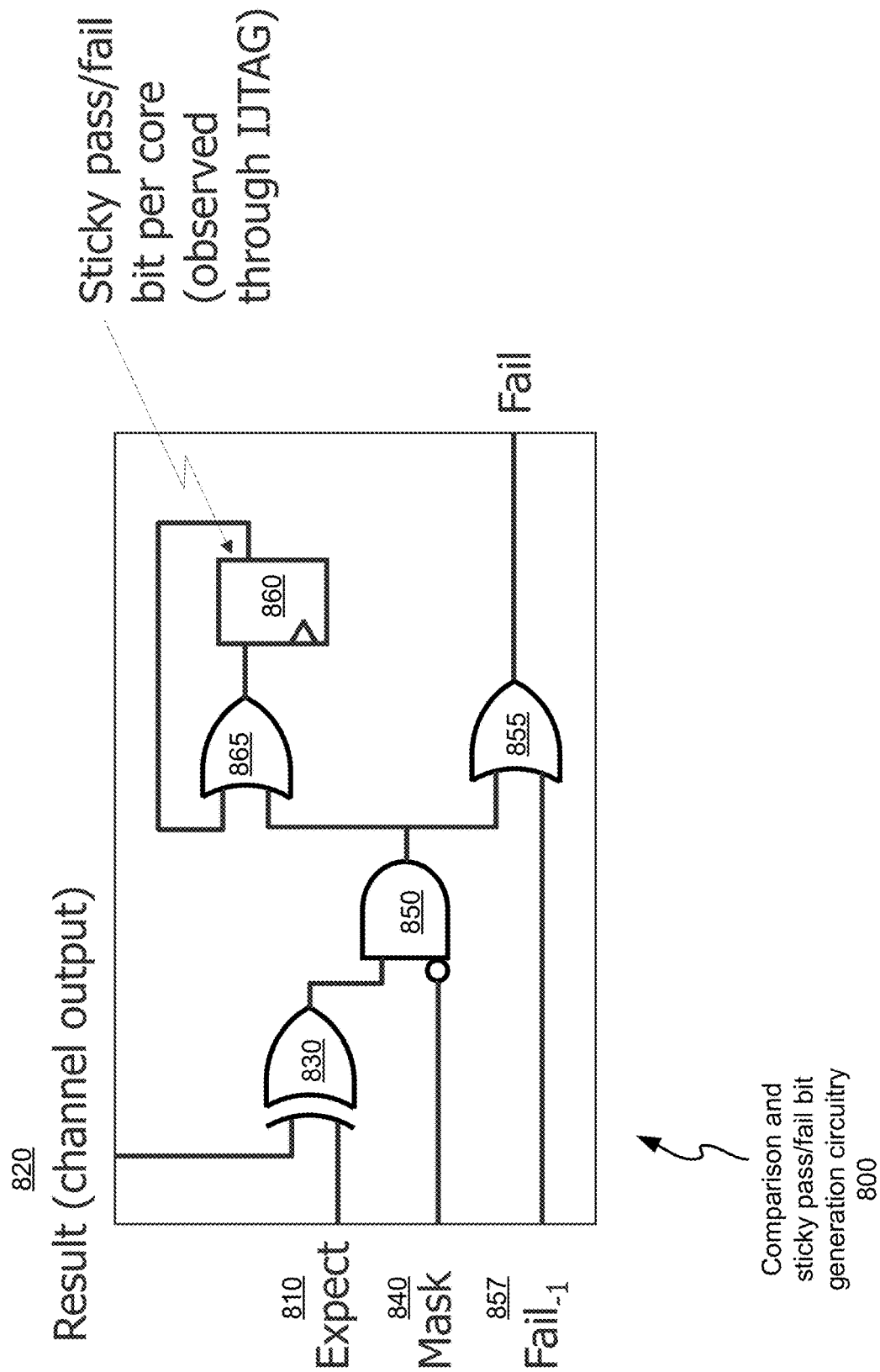
FIG. 8A illustrates an example of comparison and sticky pass/fail bit generation circuitry 800 that may be implemented according to various embodiments of the disclosed technology.
Figure 8B:
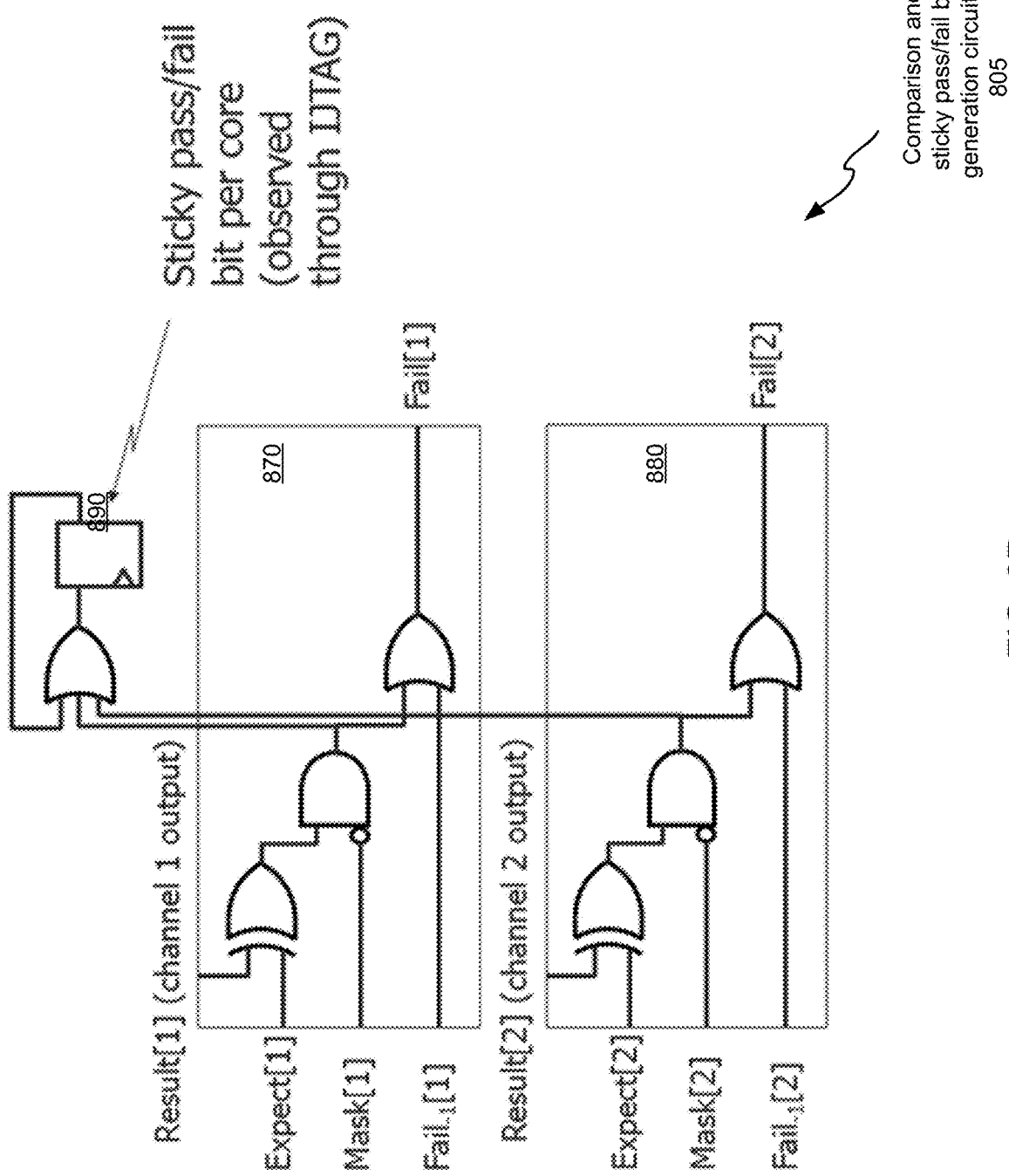
FIG. 8B illustrates an example of comparison and sticky pass/fail bit generation circuitry 805 for a circuit block having two output channels that may be implemented according to various embodiments of the disclosed technology.

An example of comparison and sticky pass/fail bit generation circuitry 800 is shown in FIG. 8A. In this case, a data packet further comprises one or more bits of good-machine test responses (expected bits 810). The expected bits are compared with captured test response bits 820 using an XOR gate 830. A data packet may still further comprises a masking data bits masking one or more indeterminable bits (X bits 840) in the test response bits using an AND gate 850. The derived bit is combined with the corresponding bit from the previous core (Fail$_{-1}$ 857) by an OR gate 855. An OR gate 865 and a flip-flop 860 form sticky pass/fail bit generation circuitry. A derived sticky pass/fail bit is stored in a flip-flop 860, indicating whether a circuit block fails or not during a test. This bit can be transported out of the circuit by the second network, the first network after reconfigured using the second network, or a third network. In the presence of multiple output channels in the circuit block, the comparison is done per channel, but a single sticky bit can typically log the failure of the core regardless of the number of channel outputs. FIG. 8B illustrates an example of comparison and sticky pass/fail bit generation circuitry 805 for a circuit block having two output channels.

Figure 9:
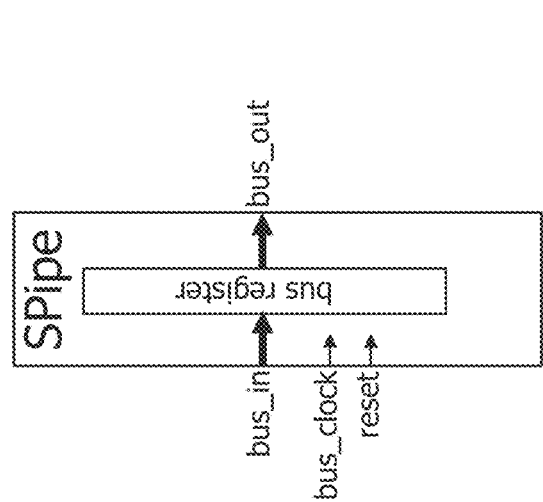
FIG. 9 illustrates an example of a pipeline device 900 that may be implemented according to various embodiments of the disclosed technology.

Referring to FIG. 2, the first network 220 may further comprise multiplexing devices, pipeline devices or both. FIG. 9 illustrates an example of a pipeline device 900 that may be implemented according to various embodiments of the disclosed technology. The pipeline device 900 can be used to meet timing requirements. If there is a long route between two cores, or between cores and chip-level I/Os, the propagation delay through that route may impede the ability to operate the bus at a high frequency. To reducing the length of the route that the data propagates through within one cycle, one or more pipeline devices may be inserted. Once data starts propagating through the first network 220 and nodes in the network are filled with data, there is no loss of throughput due to the presence of additional nodes such as those pipeline stages. Their presence may slightly increase latency at the start of test application.

Figure 10:
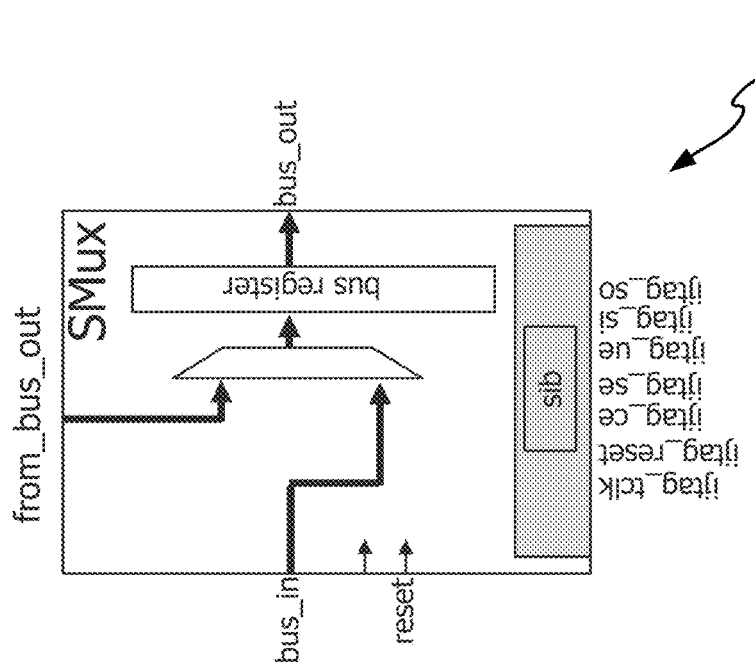
FIG. 10 illustrates an example of a multiplexing device 1000 that may be implemented according to various embodiments of the disclosed technology.
Figure 11:
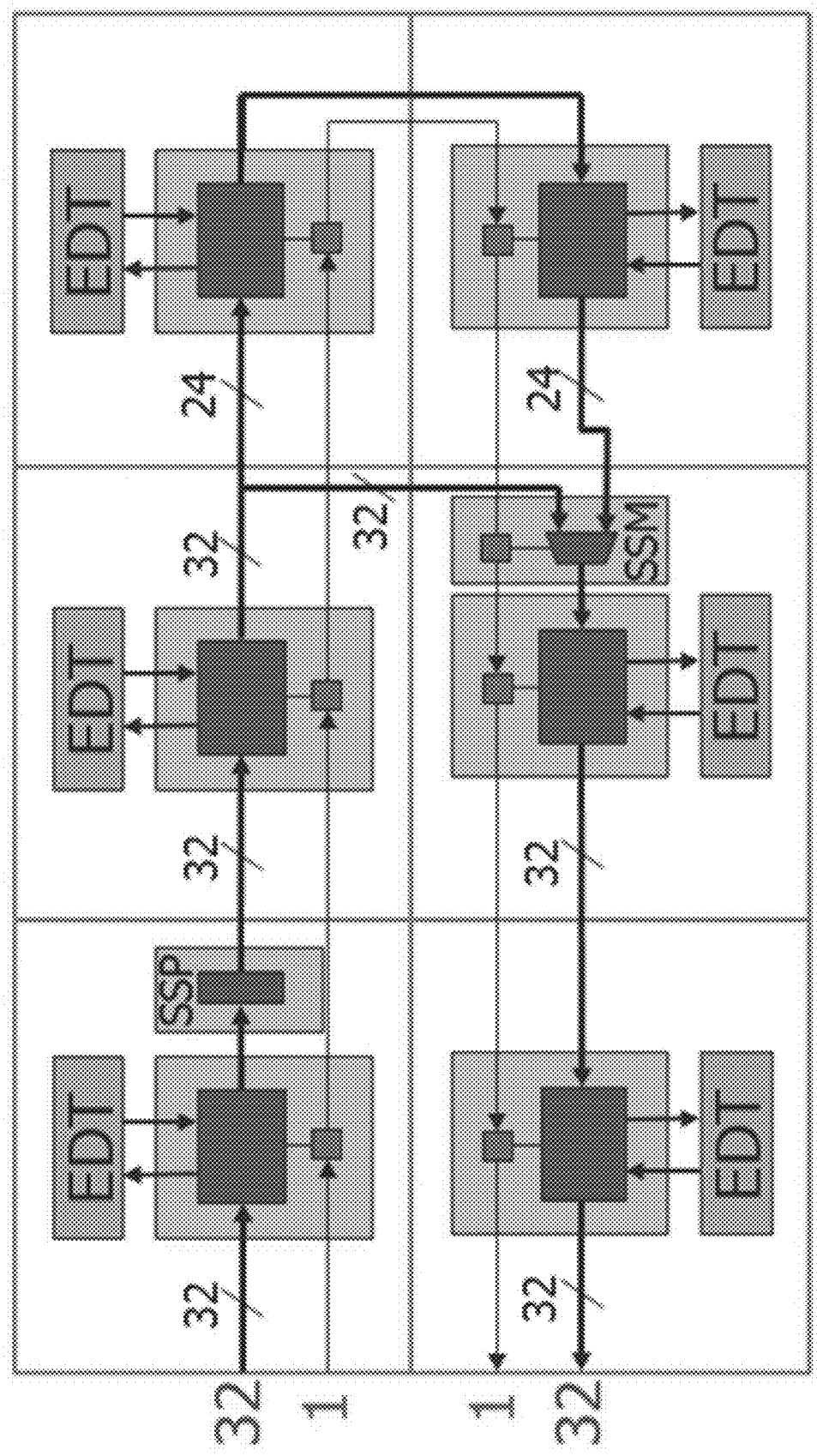
FIG. 11 illustrates an example of linking different width sections of a first network.

FIG. 10 illustrates an example of a multiplexing device 1000 that may be implemented according to various embodiments of the disclosed technology. The multiplexing device 1000 can select which of two preceding nodes to connect to its output. It serves the same purpose as a Segment Insertion Bit (SIB) node does in the IJTAG standard. Such a node allows a portion of the network to be included in the network, or bypassed when inactive. This enables among others: 1) Improving efficiency by bypassing a portion of the network when not being used; 2) improving operational flexibility by allowing, for example, cores including the inactive part of the network to be powered down without breaking the operation of the active portion of the network; 3) bypassing, without disabling the entire network, a portion of the network when there is a manufacturing defect in that portion of the network; and 4) linking different width sections of the network, allowing the use of the full wider width when the smaller width section is bypassed. FIG. 11 illustrates an example of the last case. The first network has the first interface devices that are 32 bits and the first interface devices that are 24 bits. When both sets of the first interface devices are active, the entire bus and all nodes on it have to operate at 24 bits. But if the 24-bit nodes are inactive and bypassed, the remaining 32-bit nodes can operate at their full 32-bit bus width.

Figure 12:
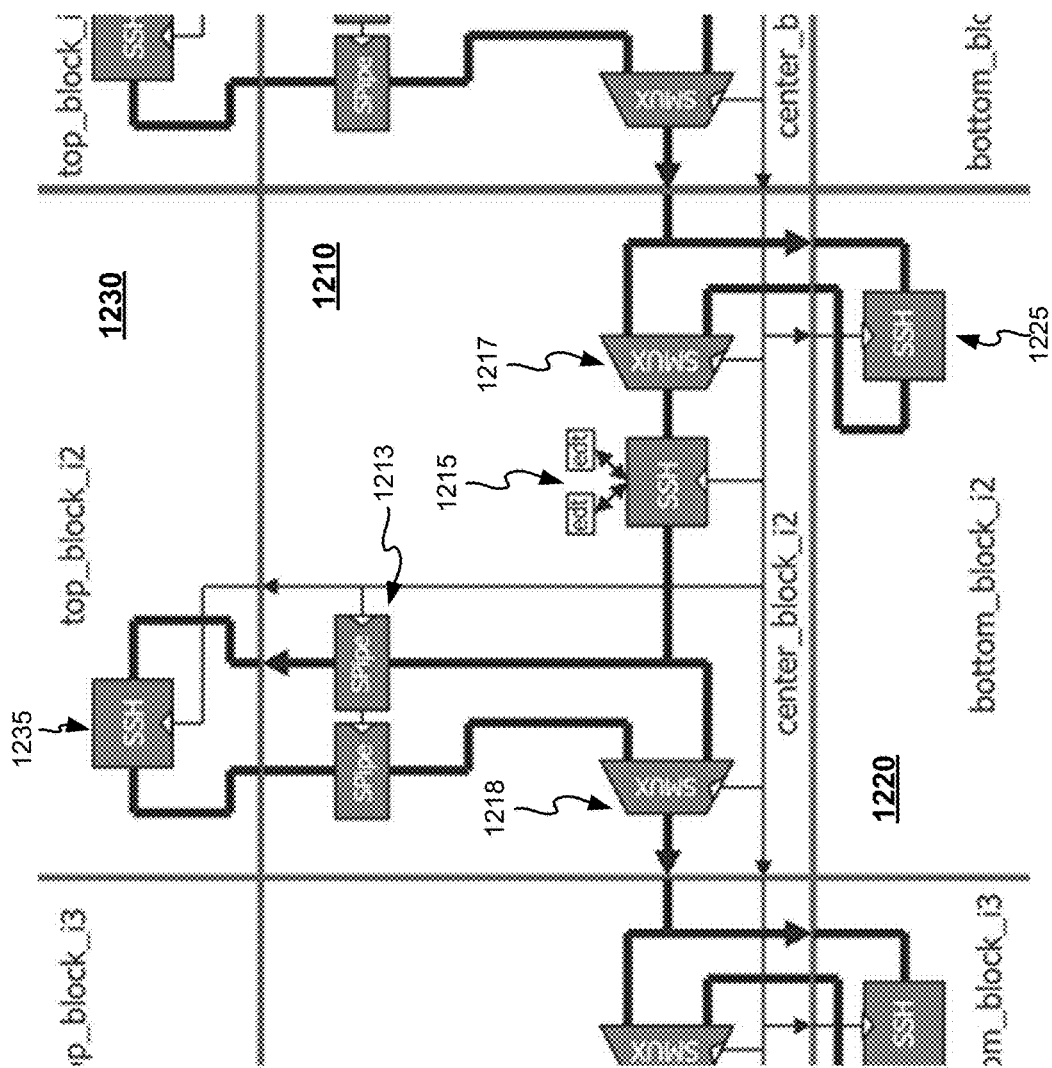
FIG. 12 illustrates an example of using multiplexing devices and pipeline devices in a first network.

FIG. 12 illustrates an example of using multiplexing devices and pipeline devices in a first network. Three circuit blocks (titles) 1210, 1220 and 1230 are shown in the middle of the figure. Three first interface devices 1215, 1225 and 1235 are coupled to ports of these circuit blocks, respectively. In particular, two EDT controllers are shown to couple to the first interface devices 1215 for illustration purposes. A multiplexing device 1217 allows a part of the first network that includes the first interface device 1225 to be bypassed if needed, while another multiplexing device 1218 allows a part of the first network that includes the first interface device 1235 to be bypassed if needed. Because the routes to/from the first interface device 1235 are long, two pipeline devices 1213 are inserted to meet timing requirements. This whole arrangement can repeat for other neighboring circuit blocks.

Illustrative Computing Environment

Figure 13:
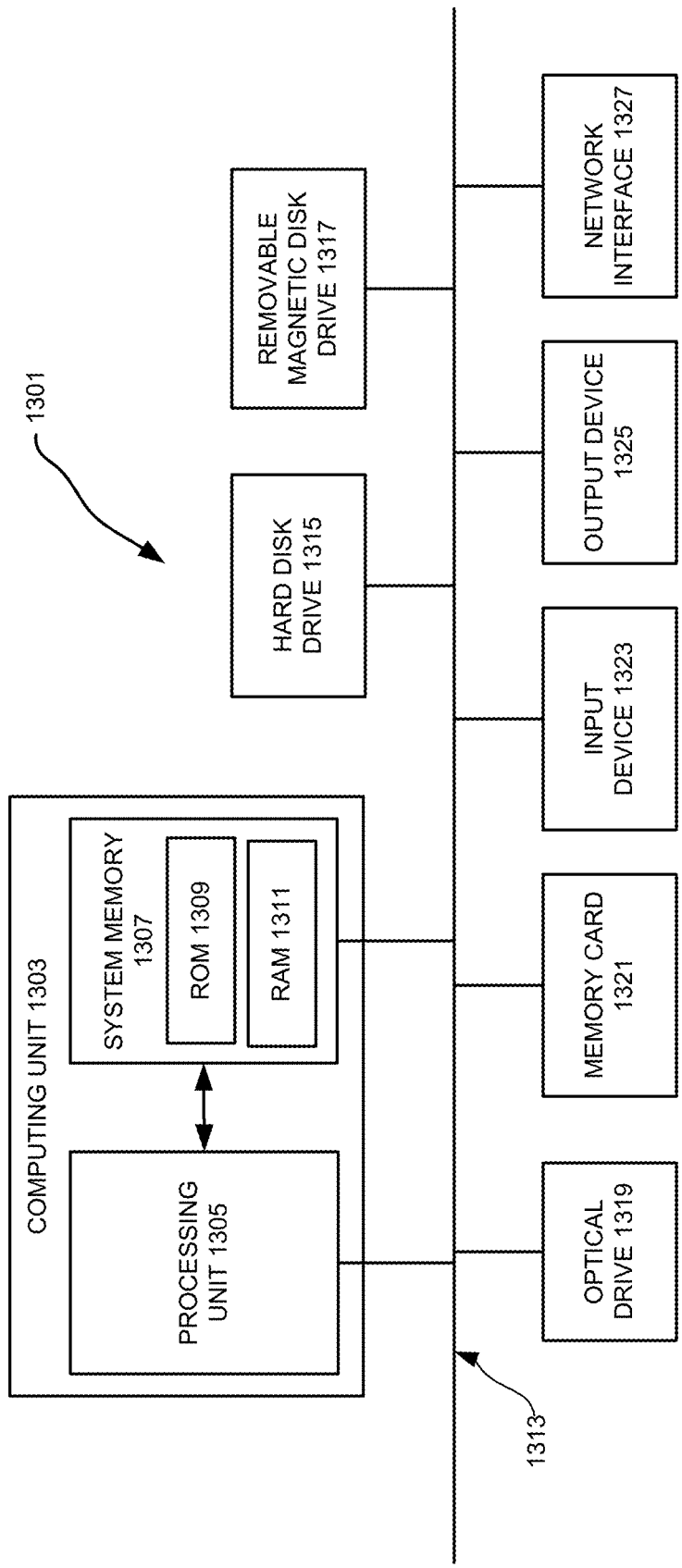
FIG. 13 illustrates a programmable computer system with which various embodiments of the disclosed technology may be employed.

Some embodiments of the disclosed technology related to generating a system of streaming data in a circuit design may be implemented through the execution of software instructions by a computing device, such as a programmable computer. FIG. 13 shows an illustrative example of such a programmable computer (a computing device 1301). As seen in this figure, the computing device 1301 includes a computing unit 1303 with a processing unit 1305 and a system memory 1307. The processing unit 1305 may be any type of programmable electronic device for executing software instructions, but will conventionally be a microprocessor. The system memory 1307 may include both a read-only memory (ROM) 1309 and a random access memory (RAM) 1311. As will be appreciated by those of ordinary skill in the art, both the read-only memory (ROM) 1309 and the random access memory (RAM) 1311 may store software instructions for execution by the processing unit 1305.

The processing unit 1305 and the system memory 1307 are connected, either directly or indirectly, through a bus 1313 or alternate communication structure, to one or more peripheral devices. For example, the processing unit 1305 or the system memory 1307 may be directly or indirectly connected to one or more additional memory storage devices, such as a "hard" magnetic disk drive 1315, a removable magnetic disk drive 1317, an optical disk drive 1319, or a flash memory card 1321. The processing unit 1305 and the system memory 1307 also may be directly or indirectly connected to one or more input devices 1323 and one or more output devices 1325. The input devices 1323 may include, for example, a keyboard, a pointing device (such as a mouse, touchpad, stylus, trackball, or joystick), a scanner, a camera, and a microphone. The output devices 1325 may include, for example, a monitor display, a printer and speakers. With various examples of the computer 1301, one or more of the peripheral devices 1315-1325 may be internally housed with the computing unit 1303. Alternately, one or more of the peripheral devices 1315-1325 may be external to the housing for the computing unit 1303 and connected to the bus 1313 through, for example, a Universal Serial Bus (USB) connection.

With some implementations, the computing unit 1303 may be directly or indirectly connected to one or more network interfaces 1327 for communicating with other devices making up a network. The network interface 1327 translates data and control signals from the computing unit 1303 into network messages according to one or more communication protocols, such as the transmission control protocol (TCP) and the Internet protocol (IP). Also, the interface 1327 may employ any suitable connection agent (or combination of agents) for connecting to a network, including, for example, a wireless transceiver, a modem, or an Ethernet connection. Such network interfaces and protocols are well known in the art, and thus will not be discussed here in more detail.

It should be appreciated that the computer 1301 is illustrated as an example only, and it not intended to be limiting. Various embodiments of the disclosed technology may be implemented using one or more computing devices that include the components of the computer 1301 illustrated in FIG. 13, which include only a subset of the components illustrated in FIG. 13, or which include an alternate combination of components, including components that are not shown in FIG. 13. For example, various embodiments of the disclosed technology may be implemented using a multiprocessor computer, a plurality of single and/or multiprocessor computers arranged into a network, or some combination of both.

CONCLUSION

While the disclosed technology has been described with respect to specific examples including presently preferred modes of carrying out the disclosed technology, those skilled in the art will appreciate that there are numerous variations and permutations of the above described systems and technology that fall within the spirit and scope of the disclosed technology as set forth in the appended claims. For example, while streaming test data has been employed to describe the disclosed technology, it should be appreciated that various examples of the disclosed technology may be applied to streaming other types of data.

What is claimed is:

1. A system for streaming data in a circuit, comprising:
   a first network comprising first data channels and first interface devices, the first interface devices comprising registers and clock signal generation logic, each of the first interface devices being coupled to ports of one of circuit blocks in the circuit, the first network configurable to transport a plurality of data packets consecutively, each of the plurality of data packets having a plurality of bits, each of the plurality of bits being assigned to one of the circuit blocks preconfigured in an active mode, a number of the plurality of bits being equal to or greater than a number of the first data channels used for the transporting the plurality of data packets; and
   a second network comprising one or more second data channels and second interface devices, each of the first interface devices being coupled to one of the second interface devices, the second network configurable to transport configuration data to the first interface devices, the configuration data comprising data for determining whether or not a first interface device in the first interface devices is activated and data for determining which bit or bits of each of the plurality of data packets to be captured, replaced, or captured and replaced by each of the first interface devices activated.

2. The system recited in claim 1, wherein each of the plurality of data packets comprises one or more bits of a test pattern or a compressed test pattern for testing one or more of the circuit blocks, the clock signal generation logic in a first interface device coupled to ports of each of the one or more of the circuit blocks is configurable to generate clock signals for scan-based testing, and the ports of each of the one or more of the circuit blocks comprise inputs and outputs of scan chains, inputs and outputs of one or more test controllers, or a combination thereof, each of the one or more test controllers comprising a decompressor and a compactor.

3. The system recited in claim 2, wherein the one or more test controllers comprise EDT(embedded deterministic test)-based test controllers.

4. The system recited in claim 2, wherein the first interface device coupled to ports of each of the one or more of the circuit blocks is configurable to capture the one or more bits of the test pattern or the compressed test pattern from the each of the plurality of data packets and to replace the one or more bits of the test pattern or the compressed test pattern in the each of the plurality of data packets with one or more bits of test responses received from the ports of the each of the one or more of the circuit blocks.

5. The system recited in claim 2, wherein each of the plurality of data packets further comprises one or more bits of good-machine test responses to the test pattern or the compressed test pattern, and the first interface device coupled to ports of each of the one or more of the circuit blocks further comprises comparison circuitry configurable to generate one or more comparison bits by comparing one or more bits of test responses with the one or more bits of the good-machine test responses.

6. The system recited in claim 5, wherein the first interface device coupled to ports of each of the one or more of the circuit blocks further comprises sticky pass/fail bit generation circuitry.

7. The system recited in claim 6, wherein a sticky pass/fail bit generated by the sticky pass/fail bit generation circuitry is transported out of the circuit by the second network, the first network after reconfigured using the second network, or a third network.

8. The system recited in claim 5, wherein each of the plurality of data packets further comprises one or more masking data bits masking one or more indeterminable bits (X bits) in the one or more bits of test responses for the comparison circuitry.

9. The system recited in claim 1, wherein each of the plurality of data packets comprises bit or bits of data to be stored in memory circuitry in one or more of the circuit blocks in the active mode.

10. The system recited in claim 1, wherein the second network conforms to the IEEE 1687 standard (IJTAG, Internal Joint Test Action Group).

11. The system recited in claim 1, wherein the first network further comprises multiplexing devices, pipeline devices or both, the multiplexing devices configurable to change data streaming path of the first network.

12. The system recited in claim 1, wherein the number of the first data channels being used for the transporting the plurality of data packets is smaller than the number of the first data channels in a particular setup.

13. The system recited in claim 12, wherein the particular setup is a setup for wafer testing.

14. The system recited in claim 1, wherein the first network transports the plurality of data packets at a rate of one word having a number of bits equal to the number of first data channels used for the transporting the plurality of data packets per clock cycle, and if the number of the plurality of bits for each of the plurality of data packets is greater than the number of first data channels used for the transporting the plurality of data packets, bit assignment to the circuit blocks in the active mode for a particular n bit word having a number of bits equal to the number of first data channels used for the transporting the plurality of data packets repeats every a certain number of clock cycles, the certain number being a least common multiple of the number of first data channels used for the transporting the plurality of data packets and the number of the plurality of bits for each of the plurality of data packets.

15. The system recited in claim 14, wherein bits in each of the plurality of data packets are divided into bit blocks, bits in each of the bit blocks being next to bits in the each of the bit blocks except bits at two ends, each of the bit blocks being assigned to one of the circuit blocks preconfigured in the active mode.

16. One or more non-transitory computer-readable media storing computer-executable instructions for causing a computer to perform a method, the method comprising:
generating a system in a circuit design for a circuit, the system comprising:
a first network comprising first data channels and first interface devices, the first interface devices comprising registers and clock signal generation logic, each of the first interface devices being coupled to ports of one of circuit blocks in the circuit, the first network configurable to transport a plurality of data packets consecutively, each of the plurality of data packets having a plurality of bits, each of the plurality of bits being assigned to one of the circuit blocks preconfigured in an active mode, a number of the plurality of bits being equal to or greater than a number of the first data channels used for the transporting the plurality of data packets; and
a second network comprising one or more second data channels and second interface devices, each of the first interface devices being coupled to one of the second interface devices, the second network configurable to transport configuration data to the first interface devices, the configuration data comprising data for determining whether or not a first interface device in the first interface devices is activated and data for determining which bit or bits of each of the plurality of data packets to be captured, replaced, or captured and replaced by each of the first interface devices activated.

17. The one or more non-transitory computer-readable media recited in claim 16, wherein each of the plurality of data packets comprises one or more bits of a test pattern or a compressed test pattern for testing one or more of the circuit blocks, the clock signal generation logic in a first interface device coupled to ports of each of the one or more of the circuit blocks is configurable to generate clock signals for scan-based testing, and the ports of each of the one or more of the circuit blocks comprise inputs and outputs of scan chains, inputs and outputs of one or more test controllers, or a combination thereof, each of the one or more test controllers comprising a decompressor and a compactor.

18. The one or more non-transitory computer-readable media recited in claim 17, wherein the one or more test controllers comprise EDT(embedded deterministic test)-based test controllers.

19. The one or more non-transitory computer-readable media recited in claim 17, wherein the first interface device coupled to ports of each of the one or more of the circuit blocks is configurable to capture the one or more bits of the test pattern or the compressed test pattern from the each of the plurality of data packets and to replace the one or more bits of the test pattern or the compressed test pattern in the each of the plurality of data packets with one or more bits of test responses received from the ports of the each of the one or more of the circuit blocks.

20. The one or more non-transitory computer-readable media recited in claim 17, wherein each of the plurality of data packets further comprises one or more bits of good-machine test responses to the test pattern or the compressed test pattern, and the first interface device coupled to ports of each of the one or more of the circuit blocks further comprises comparison circuitry configurable to generate one or more comparison bits by comparing one or more bits of test responses with the one or more bits of the good-machine test responses.

21. The one or more non-transitory computer-readable media recited in claim 20, wherein the first interface device coupled to ports of each of the one or more of the circuit blocks further comprises sticky pass/fail bit generation circuitry.

22. The one or more non-transitory computer-readable media recited in claim 21, wherein a sticky pass/fail bit generated by the sticky pass/fail bit generation circuitry is transported out of the circuit by the second network, the first network after reconfigured using the second network, or a third network.

23. The one or more non-transitory computer-readable media recited in claim 20, wherein each of the plurality of data packets further comprises one or more masking data bits masking one or more indeterminable bits (X bits) in the one or more bits of test responses for the comparison circuitry.

24. The one or more non-transitory computer-readable media recited in claim 16, wherein each of the plurality of data packets comprises bit or bits of data to be stored in memory circuitry in one or more of the circuit blocks in the active mode.

25. The one or more non-transitory computer-readable media recited in claim 16, wherein the second network conforms to the IEEE 1687 standard (IJTAG, Internal Joint Test Action Group).

26. The one or more non-transitory computer-readable media recited in claim 16, wherein the first network further comprises multiplexing devices, pipeline devices or both, the multiplexing devices configurable to change data streaming path of the first network.

27. The one or more non-transitory computer-readable media recited in claim 16, wherein the number of the first data channels being used for the transporting the plurality of data packets is smaller than the number of the first data channels in a particular setup.

28. The one or more non-transitory computer-readable media recited in claim 27, wherein the particular setup is a setup for wafer testing.

29. The one or more non-transitory computer-readable media recited in claim 16, wherein the first network transports the plurality of data packets at a rate of one word having a number of bits equal to the number of first data channels used for the transporting the plurality of data packets per clock cycle, and if the number of the plurality of bits for each of the plurality of data packets is greater than the number of first data channels used for the transporting the plurality of data packets, bit assignment to the circuit blocks in the active mode for a particular word having a number of bits equal to the number of first data channels used for the transporting the plurality of data packets repeats every a certain number of clock cycles, the certain number being a least common multiple of the number of first data channels used for the transporting the plurality of data packets and the number of the plurality of bits for each of the plurality of data packets.

30. The one or more non-transitory computer-readable media recited in claim 29, wherein bits in each of the plurality of data packets are divided into bit blocks, bits in each of the bit blocks being next to bits in the each of the bit blocks except bits at two ends, each of the bit blocks being assigned to one of the circuit blocks preconfigured in the active mode.

\* \* \* \* \*